(12) United States Patent
Wells et al.

(10) Patent No.: US 8,780,607 B2
(45) Date of Patent: Jul. 15, 2014

(54) SELECT DEVICES FOR MEMORY CELL APPLICATIONS

(75) Inventors: David H. Wells, Boise, ID (US); D. V. Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 214 days.

(21) Appl. No.: 13/234,771

(22) Filed: Sep. 16, 2011

(65) Prior Publication Data

US 2013/0070511 A1 Mar. 21, 2013

(51) Int. Cl.
G11C 11/00 (2006.01)

(52) U.S. Cl.
USPC ........... 365/148; 365/175; 365/180; 365/158; 365/171; 365/173

(58) Field of Classification Search
USPC ............... 365/175, 180, 148, 158, 171, 173
See application file for complete search history.

(56) References Cited

U.S. PATENT DOCUMENTS

| | | | |
|---|---|---|---|
| 7,608,514 B2 | 10/2009 | Hsu et al. | |
| 7,764,477 B2 | 7/2010 | Tang et al. | |
| 7,884,349 B2 | 2/2011 | Rinerson et al. | |
| 7,888,240 B2 | 2/2011 | Hamamjy et al. | |
| 7,897,951 B2 | 3/2011 | Rinerson et al. | |
| 7,957,207 B2 | 6/2011 | Parkinson | |
| 2004/0016923 A1 | 1/2004 | Yu et al. | |
| 2007/0015348 A1 | 1/2007 | Hsu et al. | |
| 2007/0080345 A1 | 4/2007 | Joo et al. | |
| 2009/0032817 A1 | 2/2009 | Li et al. | |
| 2010/0102298 A1 | 4/2010 | Wu | |
| 2010/0123542 A1 | 5/2010 | Vaithyanathan et al. | |
| 2010/0157666 A1 | 6/2010 | Parkinson | |
| 2010/0162067 A1 | 6/2010 | Norman | |
| 2010/0315866 A1* | 12/2010 | Park et al. | 365/163 |
| 2011/0006276 A1 | 1/2011 | Kim et al. | |
| 2011/0007544 A1 | 1/2011 | Vaithyanathan et al. | |

(Continued)

OTHER PUBLICATIONS

Lee et al., "2-Stack 1D-1R Cross-point Structure with Oxide Diodes as Switch Elements for High Density Resistance RAM Applications," Electron Devices Meeting, IEDM 2007, IEEE International, pp. 771-774, Dec. 10-12, 2007.

(Continued)

Primary Examiner — Vu Le
Assistant Examiner — Han Yang
(74) Attorney, Agent, or Firm — Brooks, Cameron & Huebsch, PLLC (57) ABSTRACT

Select devices for memory cell applications and methods of forming the same are described herein. As an example, one or more memory cells comprise a a select device structure including a two terminal select device having a current-voltage (I-V) profile associated therewith, and a non-ohmic device in series with the two terminal select device. The combined two terminal select device and non-ohmic device provide a composite I-V profile of the select device structure that includes a modified characteristic as compared to the I-V profile, and the modified characteristic is based on at least one operating voltage associated with the memory cell.

25 Claims, 4 Drawing Sheets

(56) References Cited

U.S. PATENT DOCUMENTS

| | | |
|---|---|---|
| 2011/0007551 A1 | 1/2011 | Tian et al. |
| 2011/0051494 A1 | 3/2011 | Kohlstedt |
| 2011/0062408 A1 | 3/2011 | Kozicki |
| 2011/0069529 A1 | 3/2011 | Srinivasan et al. |
| 2011/0134685 A1* | 6/2011 | Kau et al. ............ 365/163 |
| 2011/0194338 A1 | 8/2011 | Baek et al. |
| 2012/0080665 A1 | 4/2012 | Blom et al. |
| 2013/0001494 A1* | 1/2013 | Chen et al. ............ 257/1 |
| 2013/0069028 A1 | 3/2013 | Wells et al. |
| 2013/0069030 A1 | 3/2013 | Wells et al. |

OTHER PUBLICATIONS

Jo, "Nanoscale Memristive Devices for Memory and Logic Applications," PhD Dissertation at Univ. of Michigan, 2010, found online at http://deepblue.lib.umich.edu/handle/2027.42/75835, 19 pp.

Non-Final Office Action from U.S. Appl. No. 13/234,875, dated Apr. 5, 2013, 19 pp.

Final Office Action from U.S. Appl. No. 13/234,875, dated Aug. 2, 2013, 22 pp.

Non-Final Office Action from U.S. Appl. No. 13/234,875, dated Oct. 28, 2013, 18 pp.

* cited by examiner

SELECT DEVICES FOR MEMORY CELL APPLICATIONS

TECHNICAL FIELD

The present disclosure relates generally to semiconductor memory devices and methods, and more particularly, to select devices for memory cell applications.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory, and flash memory, among others. Types of resistive memory include programmable conductor memory, and resistive random access memory (RRAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

RRAM devices include resistive memory cells that store data based on the resistance level of a storage element. The cells can be programmed to a desired state, e.g., corresponding to a particular resistance level, such as by applying sources of energy, such as positive or negative voltages to the cells for a particular duration. Some RRAM cells can be programmed to multiple states such that they can represent, e.g., store, two or more bits of data.

The programmed state of a resistive memory cell may be determined, e.g., read, for example, by sensing current through the selected resistive memory cell responsive to an applied interrogation voltage. The sensed current, which varies based on the resistance level of the memory cell, can indicate the programmed state of the resistive memory cell.

In various instances, arrays of resistive memory cells can be prone to read disturbance problems. For instance, as part of a read operation, current can flow from a selected access line, e.g., word line, through a selected memory cell, to a data/sense line, e.g., bit line. However, in various array architectures such as cross-point architectures, current also flows into unselected word lines that cross over the selected bit line. Conduction of current into unselected word lines can reduce the ability to distinguish between data states, e.g., by decreasing output impedance, among other drawbacks.

DETAILED DESCRIPTION

Select devices for memory cell applications and methods of forming the same are described herein. As an example, one or more memory cells comprise a select device structure including a two terminal select device having a current-voltage (I-V) profile associated therewith, and a non-ohmic device in series with the two terminal select device. The combined two terminal select device and non-ohmic device provide a composite I-V profile of the select device structure that includes a modified characteristic as compared to the I-V profile, and the modified characteristic is based on at least one operating voltage associated with the memory cell.

Embodiments of the present disclosure can include benefits such as providing a bi-directional select device useful for memory applications such as resistive memory applications, for instance. As an example, one or more select devices in accordance with the present disclosure can be formed at temperatures sufficiently low to support 3D stacking of memory arrays such as RRAM arrays. Various embodiments provide non-ohmic select devices having a high on current versus off current ratio (Ion/Ioff) in association with a partial select read method, such as a half select read method or third select read method. That is, Ion/Ioff at an on voltage (Von) associated with the memory array is much greater than Ion/Ioff at a corresponding half select voltage (Von/2) or third select voltage (Von/3). As an example, Ion/Ioff at Von can be at least $1 \times 10^4$ times greater than the Ion/Ioff at Von/2, in some embodiments. One or more select devices according to the present disclosure can act as a current limiter to permit high voltage bipolar programming without flowing current into unselected word lines during lower voltage read operations. As an example, embodiments of the present disclosure can support current densities on the order of $10^6$ or $10^7$ A/cm$^2$, which can be higher than other prior art select devices such as metal-insulator-metal (MIM) select devices or metal-semiconductor-metal (MSM) select devices, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Figure 1:
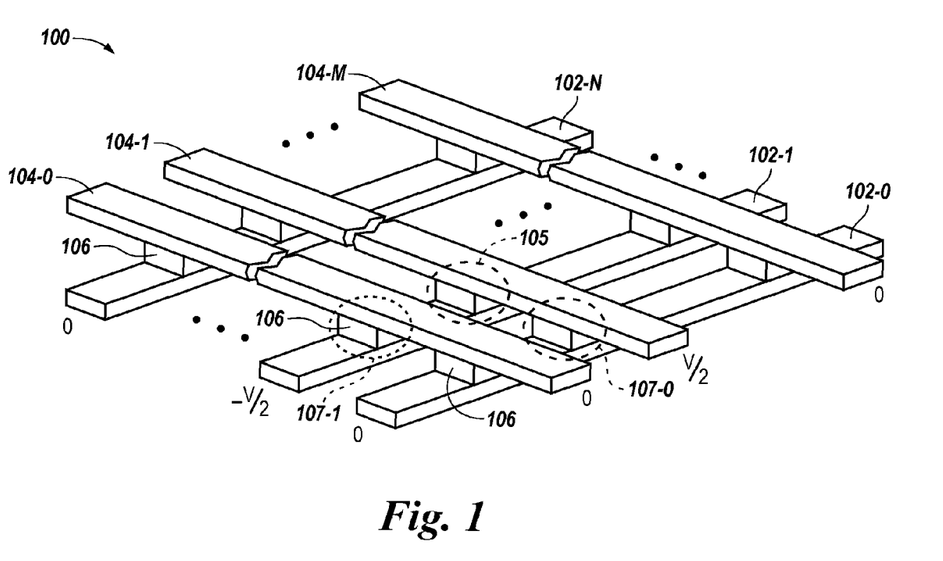
FIG. 1 is a block diagram of a portion of an array of resistive memory cells in accordance with one or more embodiments of the present disclosure.

FIG. 1 is a block diagram of a portion of an array 100 of memory cells 106 in accordance with one or more embodiments of the present disclosure. The array 100 is a two terminal cross-point array having memory cells 106 located at the intersections of a number of access lines 102-0, 102-1, . . . , 102-N, which may be referred to herein as word lines, and a number of data/sense lines 104-0, 104-1, . . . , 104-M, which may be referred to herein as bit lines. As illustrated, the word lines 102-0, 102-1, . . . , 102-N are parallel to each other and are orthogonal to the bit lines 104-0, 104-1, . . . , 104-M, which are substantially parallel to each other; however, embodiments are not so limited.

Each memory cell 106 may include a storage element, e.g. a resistive memory element coupled in series with a select device, e.g., an access device, in accordance with one or more embodiments described herein. The storage element can include a programmable portion that may have a variable resistance, for example. The storage element can include, for example, one or more resistance variable materials such as a transition metal oxide material or a perovskite including two or more metals, e.g., transition metals, alkaline earth metals, and/or rare earth metals. Other examples of resistance variable materials associated with the storage element of a memory cell 106 can include chalcogenides, binary metal oxides, colossal magnetoresistive materials, and/or various polymer-based resistive variable materials, among others. As such, the memory cells 106 can be RRAM cells, PCRAM cells, and/or conductive bridging memory cells, among various other types of resistive memory cells.

In one or more embodiments, the select device structure corresponding to each memory cell 106 includes a first two terminal select device and a second two terminal select device. The second two terminal select device can be formed in series with the first two terminal select device in order to provide a composite current-voltage (I-V) profile of the select device structure that includes a modified characteristic as compared to an I-V profile of the first two terminal select device and an I-V profile of the second two terminal select device. As an example, the modified characteristic can include a transition point of the composite I-V profile, such as a voltage at which a differential resistance changes. Example I-V profiles associated with one or more select device structures in accordance with embodiments of the present disclosure are described further in connection with FIGS. 2 and 3.

As an example, the array 100 can be operated in accordance with a half select method, e.g., a half select biasing scheme. A half select method can include applying a half select voltage (V/2) to a selected bit line, e.g., a bit line coupled to a selected memory cell, and a negative half select voltage (−V/2) to a selected word line, e.g., a word line coupled to the selected memory cell, while biasing unselected word lines at a reference potential, e.g., a ground potential. In the example illustrated in FIG. 1, memory cell 105 is a selected memory cell. That is, selected memory cell 105 is coupled to a selected bit line 104-1 biased at V/2 and a selected word line 102-1 biased at −V/2. As such, the full select voltage (V) is applied across the selected memory cell 105. The unselected memory cells coupled to the selected bit line 104-1 and selected word line 102-1, e.g., unselected memory cells 107-0 and 107-1, experience a half select voltage of +/−V/2 and can be referred to as "half selected" cells. The unselected memory cells coupled to unselected bit lines and/or word lines are unbiased, e.g., they experience a ground potential of 0V, in this example. The select voltage (V) can be a write voltage or a read voltage, for instance.

It can be beneficial for select devices to provide a half select ratio (HSR) that is as large as possible. The HSR can refer to the ratio of the current flowing through a selected memory cell, e.g., 105-1, to the current flowing through a half selected memory cell, e.g., 107-0 and 107-1. As described further below, select devices in accordance with one or more embodiments can provide a half select ratio of $10^4$:1 or $10^5$:1 or larger, for example. The larger the HSR, the lower the power dissipation caused by current flow in half-selected memory cells, e.g., 107-0 and 107-1, and the greater the signal to noise ratio (S/N) during read and/or write operations, which can reduce the likelihood of read and/or write disturb to half selected memory cells. The half select method is provided as one example and embodiments are not limited to a particular programming and/or read method.

Embodiments of the present disclosure are not limited to a half select method associated with programming or reading a memory cell. For instance, the array 100 can be operated in accordance with other biasing schemes, such as a one third select method. As an example, a one third select method can include applying a full select voltage (V) to a selected bit line and a ground potential to a selected word line, while biasing unselected bit lines at V/3 and unselected word lines at (2V)/3, such that the voltage between unselected word lines and bit lines is about +/−V/3.

In various embodiments, the select devices corresponding to memory cells 106 of array 100 can be "bipolar" in that they permit bi-directional current flow, e.g., in both forward and reverse directions, under sufficiently high voltage bias conditions, but block current flow under lower voltage conditions. The select devices can have an associated I-V profile, e.g., I-V curve, which can be symmetric, and can have an associated differential resistance that decreases with increasing voltage.

Figure 2:
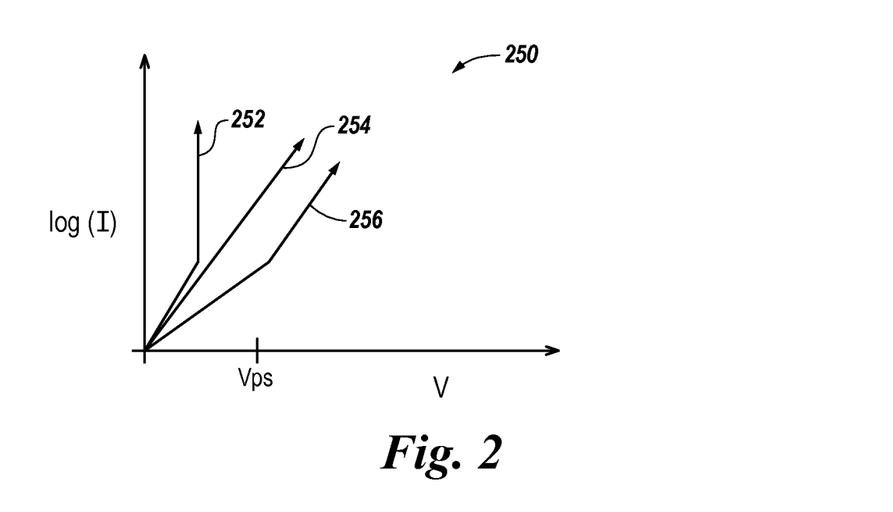
FIG. 2 illustrates a current versus voltage diagram associated with a select device structure in accordance with one or more embodiments of the present disclosure.

FIG. 2 illustrates a current versus voltage diagram 250 associated with a select device structure in accordance with one or more embodiments of the present disclosure. In the example illustrated in FIG. 2, I-V profile 252 corresponds to a first select device, the I-V profile 254 corresponds to a second select device, and I-V profile 256 is a composite I-V profile corresponding to a select device structure comprising the first select device formed in series with the second select device. In various embodiments, the first and/or second select devices can be two terminal non-ohmic select devices. As described further below, the first and second select devices can be formed concurrently in accordance with a self-aligned cross point fabrication method, in one or more embodiments.

For instance, the select device corresponding to profile 252 can be a two terminal non-ohmic select device, e.g., a MSM select device. As illustrated in FIG. 2, the profile 252 shows a tunneling signature representing a transition from indirect tunneling (as illustrated by a higher differential resistance, e.g., shallower slope) to direct tunneling (as illustrated by a lower differential resistance, e.g., steeper slope) at a particular voltage level. For various memory applications, such as RRAM operations, it can be beneficial for a select device to have an I-V profile that transitions from a higher differential resistance to a lower differential resistance at a particular voltage level, e.g., a particular operating voltage associated with the memory array.

For example, to limit current through partially selected cells, it can be desirable for the transition voltage level, e.g., the voltage level at which the I-V profile transitions from high to low differential resistance, to occur at a voltage level at or beyond a partial select voltage. In the diagram 250, a partial select voltage (Vps) 255 associated with a resistive memory cell is illustrated. As indicated, the transition voltage level associated with profile 252 occurs at a voltage below the Vps 255. As such, partially selected resistive memory cells coupled to a select device corresponding to profile 252 are susceptible to leakage and disturb effects.

However, one or more embodiments of the present disclosure include providing a select device structure comprising at least one additional select device formed in series with a first select device in order to provide a composite select device structure with a corresponding composite I-V profile having a modified characteristic as compared to an I-V profile of the first select device and the at least one additional select device. That is, the at least one additional select device can act as a voltage buffer to adjust, e.g., shift, an I-V profile associated with the first select device. In the example illustrated in FIG. 2, profile 256 represents the composite I-V profile of the select devices corresponding to profiles 252 and 254, e.g., the I-V profiles of the first select device corresponding to profile 252 and a voltage buffer select device corresponding to profile 254. As an example, the at least one additional select device, e.g., the voltage buffer select device, corresponding to profile 254 can be a MSM select device. In the example shown in FIG. 2, the select device corresponding to profile 254 is a MSM select device having a thicker semiconductor material as compared to the MSM select device corresponding to profile 252. As such, profile 254 shows a continuous indirect tunneling signature, e.g., the profile 254 does not exhibit a transition point from an indirect tunneling signature to a direct tunneling signature as illustrated by profile 252.

As shown, a voltage level at which the differential resistance associated with the composite profile 256 transitions from a higher differential resistance to a lower differential resistance occurs at a voltage greater than the partial select voltage 255. As such, partially selected resistive memory cells coupled to the select device structure corresponding to composite I-V profile 256 experience less leakage and/or disturb effects than partially selected cells coupled to either the first select device or the second select device individually.

As an example, the partial select voltage 255 can be a half select voltage or a one third select voltage. For instance, a resistive memory array may have an associated select voltage, e.g., a full select voltage, of about +/−6 Volts and an associated half select voltage of about +/−3 Volts. However, embodiments are not limited to this example. Although only the first quadrant of the I-V diagram 250 is illustrated (where voltages and currents are positive) and described above, an analogous description can apply to the second quadrant (where voltage is negative and current is positive), e.g., for symmetric bidirectional select devices.

Figure 3:
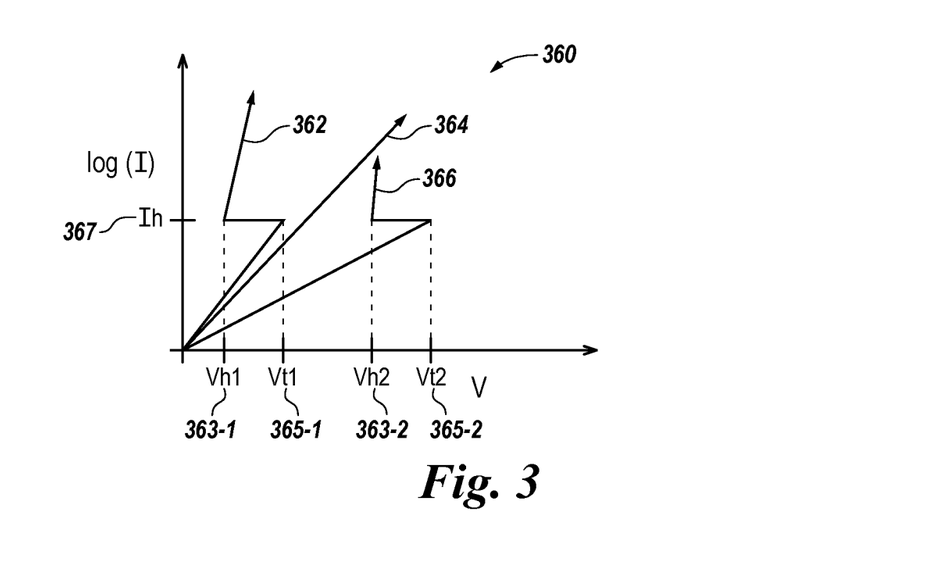
FIG. 3 illustrates a current versus voltage diagram associated with a select device structure in accordance with one or more embodiments of the present disclosure.

FIG. 3 illustrates a current versus voltage diagram 360 associated with a select device structure in accordance with one or more embodiments of the present disclosure. In the example illustrated in FIG. 3, I-V profile 362 corresponds to a first select device, the I-V profile 364 corresponds to a second select device, and I-V profile 366 is a composite I-V profile corresponding to a select device structure comprising the first select device formed in series with the second select device.

In this example, the select device corresponding to profile 362 can be a two terminal ovonic threshold switch (OTS) device, for instance. An OTS can include, for example, a chalcogenide material formed between a pair of conductive materials, e.g., conductive electrodes. As illustrated in FIG. 3, the profile 362 includes a corresponding holding voltage (Vh1) 363-1 and threshold voltage (Vt1) 365-1. Responsive to an applied voltage across the OTS that is less than Vt1, the OTS remains in an "off" state, e.g., an electrically nonconductive state. Alternatively, responsive to an applied voltage across the OTS that is greater than Vt1, the device enters an "on" state, e.g., an electrically conductive state. As shown in FIG. 3, responsive to an applied voltage near Vt1, the voltage across the device may "snapback" to the holding voltage 363-1 (as indicated by the dashed line). The portion of profile 362 below the dashed line can be referred to as the "off branch" of profile 362, and the portion above the dashed line can be referred to as the "on branch" of profile 362. As indicated in FIG. 3, the slope of the on branch associated with profile 362 is steeper than the slope of the off branch, e.g., the differential resistance of the off branch is greater than that of the on branch. The current at which the snapback occurs can be referred to as a holding current (Ih) 367.

For various memory applications, such as RRAM operations, it can be beneficial to provide a select device structure providing a "snapback" that occurs at a higher voltage level that that associated with an individual OTS, e.g., an OTS corresponding to I-V profile 362. For instance, it can be beneficial to modify the I-V profile of an OTS such that the modified profile includes a holding voltage and/or threshold voltage higher in magnitude than that associated with the unmodified profile. The modified I-V profile can include an adjusted slope of the on and/or off branch as compared to the unmodified I-V profile.

As an example, consider a partial select voltage, e.g., Vps 255 shown in FIG. 2, which is located at a voltage level above Vt1 365-1 associated with I-V profile 362. As such, partially selected resistive memory cells coupled to a select device corresponding to profile 362 are susceptible to leakage and disturb effects.

However, in the example illustrated in diagram 360, an additional select device corresponding to I-V profile 364 is formed in series with a the OTS select device corresponding to profile 362 in order to provide a composite select device structure with a corresponding composite I-V profile 366 having a modified characteristic as compared to the individual I-V profiles of the OTS select device and the additional select device. As an example, the additional select device corresponding to profile 364 can be a two terminal non-ohmic MSM select device.

The composite I-V profile 366 includes a corresponding holding voltage (Vh2) 363-2 and threshold voltage (Vt2) 365-2. As shown in FIG. 3, the holding voltage 363-2 and threshold voltage 365-2 corresponding to the composite profile 366 are shifted, e.g., increased, as compared to the holding voltage 363-1 and threshold voltage 365-1 corresponding to the I-V profile 362.

In one or more embodiments, the shift amount associated with composite profile 366 can be based on an operating voltage, e.g., a select voltage and/or partial select voltage associated with operating, e.g., reading or writing a resistive memory cell coupled to the select device structure. For instance, the I-V profile 362 can be modified by profile 364 such that the holding voltage 363-2 and/or the threshold voltage 365-2 is located at a higher voltage level than a partial select voltage associated with the resistive memory cell, which can provide benefits such as reducing leakage and/or disturb associated with the memory cell.

The I-V profiles illustrated in FIGS. 2 and 3 are shown as examples. The characteristics, e.g., shapes, of the I-V profiles of the individual select devices as well as the characteristics of the composite I-V profile of the corresponding select device structure can depend on various factors such as the type of select devices, the particular types of materials comprising the select devices, and/or the particular thicknesses of the materials, e.g., material layers, comprising the select devices, among other factors. In various embodiments, the characteristics of the select devices comprising the select device structure corresponding to a particular composite I-V profile can be tailored, e.g., tuned, to achieve a composite I-V profile having a shape useful for operating a particular type of resistive memory array, for instance.

Figure 4:
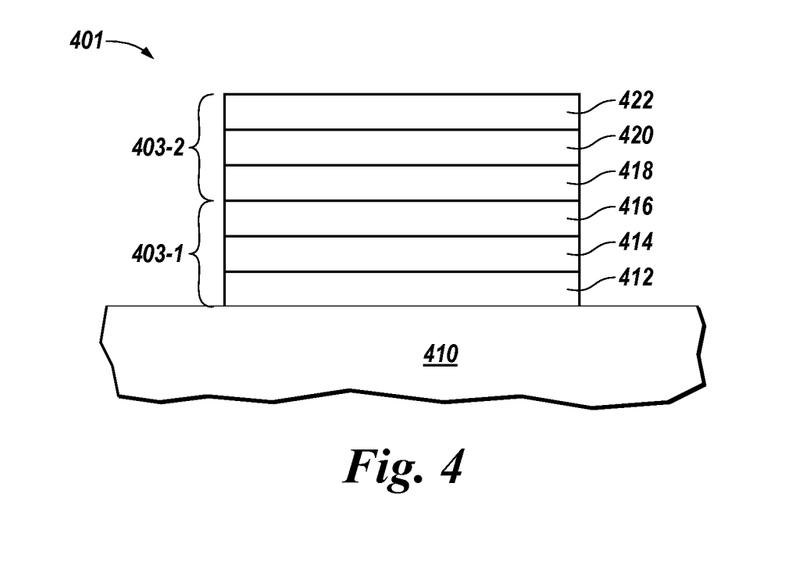
FIG. 4 illustrates a cross-sectional view of a select device structure in accordance with one or more embodiments of the present disclosure.

FIG. 4 illustrates a cross-sectional view of a select device structure 401 in accordance with one or more embodiments of the present disclosure. The select device structure 401 includes a first select device 403-1 formed in series with a second select device 403-2 on a substrate 410. The substrate 410 can be a silicon substrate, silicon on insulator (SOI) substrate, or silicon on sapphire (SOS) substrate, among various other substrate materials. As described above, in various embodiments, a composite I-V profile corresponding to the select device structure 401 includes one or more modified characteristics as compared to an I-V profile of the first two terminal select device 403-1 and an I-V profile of the second two terminal select device 403-2. For instance, as indicated by the composite I-V profile of the select device structure 401, the select device structure can provide a shifted, e.g., increased, transition voltage level at which the composite I-V profile switches from a higher to a lower differential resistance as compared to the I-V profile of the individual select devices 403-1 and 403-2. In various embodiments, the select device structure 401 is a non-ohmic device having a composite I-V profile that is exponential with voltage for at least a portion of the I-V profile.

As an example, the select devices 403-1 and/or 403-2 can be two terminal non-ohmic metal-semiconductor-metal (MSM) select devices. In one or more embodiments, the select device 403-1 can be an ovonic threshold switch device and the select device 403-2 can be a two terminal non-ohmic select device such as an MSM select device or an MIIM select device, for instance.

The material 412 can be a metal material 412 formed on substrate 410 and can serve as a first terminal, e.g., electrode, of the select device 403-1. In an example in which the select device 403-1 is an OTS, the material 414 formed on material 412 can be a chalcogenide material, and the material 416 formed on material 414 can be a metal material 416 serving as a second terminal of the select device 403-1. The material 418 can be a metal material 418 formed on metal material 416 and can serve as a first terminal of the select device 403-2. In an example in which the select device 403-2 is an MSM device, the material 420 formed on metal material 418 can be a semiconductor material 420, such as polysilicon and/or germanium, for instance, and the material 422 formed on material 420 can be a metal material 422 serving as a second terminal of the select device 403-2. The metal materials 412, 416, 418, and 422 can be materials such as titanium nitride (TiN), tantalum nitride (TaN), platinum, and/or a metal silicide, among various other metal materials.

The particular types of materials and thicknesses associated with the select devices 403-1 and 403-2 can depend on factors such as the characteristics of a memory cell associated with the select device structure 401. For instance, the particular characteristics of the select device 401, e.g., particular types of materials and thicknesses, can depend on a particular type of resistive memory cell and/or type of resistance variable material associated therewith. As such, the characteristics of the select device 401 can be tailored to achieve a suitable composite I-V profile corresponding to a particular type of memory cell, e.g., RRAM, PCRAM, etc. As an example, the select device 401 can be tailored such that an on/off current ratio (Ion/Ioff) associated with the select device 401 responsive to a select voltage corresponding to a partial select method can be at least about $1 \times 10^4$ times greater than Ion/Ioff responsive to a partial select voltage, e.g., a half select voltage, applied across the device 401. The Ion/Ioff ratio associated with select devices such as device 401 can be greater than the Ion/Ioff ratio associated with previous select device structures, e.g., select device structures including a single MSM select device or a single OTS select device, for instance.

Figure 5:
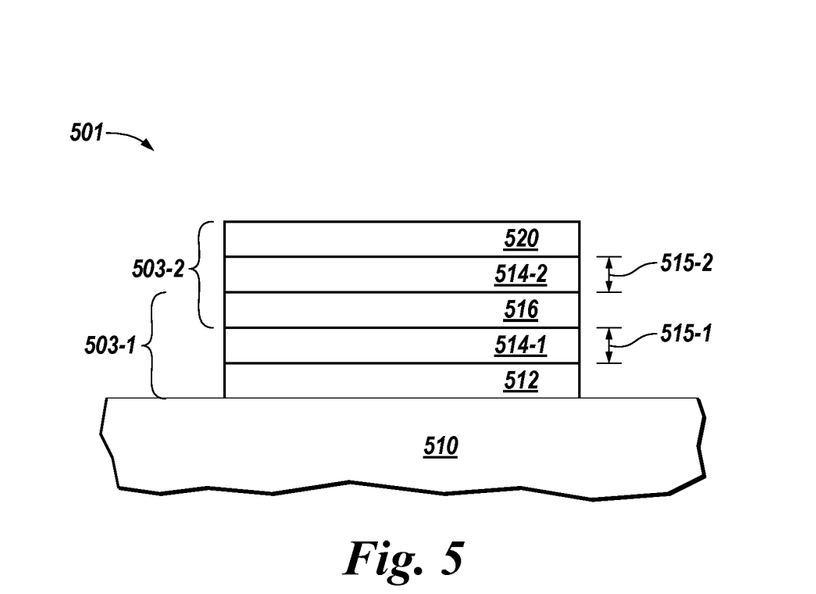
FIG. 5 illustrates a cross-sectional view of a select device structure in accordance with one or more embodiments of the present disclosure.

FIG. 5 illustrates a cross-sectional view of a two terminal non-ohmic select device structure 501 in accordance with one or more embodiments of the present disclosure. The select device structure 501 includes a first select device 503-1 formed in series with a second select device 503-2 on a substrate 510. In the example illustrated in FIG. 5, the select devices 503-1 and 503-2 share a common terminal, e.g., electrode 516.

As an example, the select devices 503-1 and/or 503-2 can be two terminal non-ohmic metal-semiconductor-metal (MSM) select devices. The material 512 can be a metal material 512 formed on substrate 510 and can serve as a first terminal, e.g., electrode, of the select device 503-1. In an example in which the select devices 503-1 and 503-2 are MSM select devices, the material 514-1 formed on material 512 can be a semiconductor material such as polysilicon and/or germanium, for instance, and the material 516 formed on material 514-1 can be a metal material 516 serving as a second terminal of the select device 503-1 and serving as a first terminal of the select device 503-2. The material 514-2 formed on metal material 516 can be a semiconductor material 514-2, such as polysilicon and/or germanium, for instance, and the material 520 formed on material 514-2 can be a metal material 520 serving as a second terminal of the select device 503-2. The metal materials 512, 516, and 520 can be materials such as titanium nitride (TiN), tantalum nitride (TaN), platinum, and/or a metal silicide, among various other metal materials.

In one or more embodiments, the thickness 515-1 of semiconductor material 514-1 can be different than the thickness 515-2 of the semiconductor material 514-2. For instance, thickness 515-1 can be greater than thickness 515-2. That is, the MSM 503-1 can be thicker than the MSM 503-2. As such, the I-V profile corresponding to the thicker MSM 503-1 can exhibit more of an indirect tunneling signature as compared to the I-V profile corresponding to the thinner MSM 503-2. In various embodiments, a thickness of the common electrode 516 can be sufficient to prevent coupling between the MSM devices 503-1 and 503-2. As such, a composite I-V profile corresponding to the select device structure 501, e.g., such as composite profile 256 shown in FIG. 2, can be shifted as compared to the I-V profiles corresponding to the separate select devices 503-1 and 503-2. As an example, the thickness of the select device structure 501 can be about 300 Angstroms or less. However, as described above, the dimensions and materials of the select devices associated with select device structure 501 can be tailored to achieve particular characteristics suitable for operating a resistive memory cell.

Figure 6:
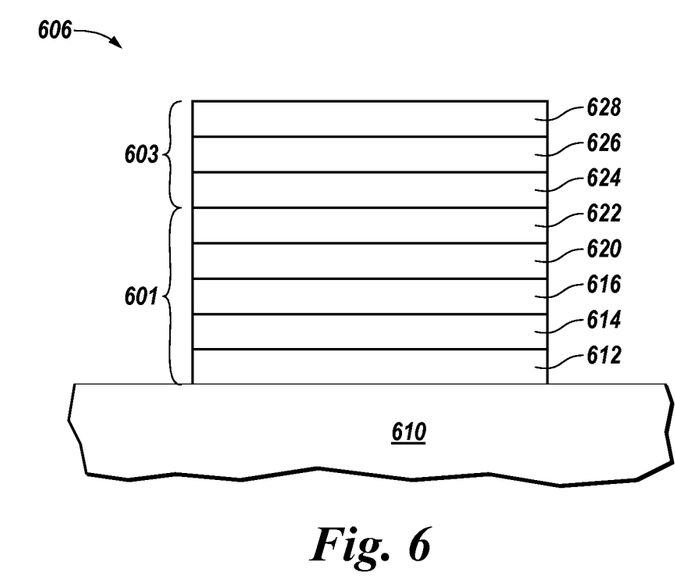
FIG. 6 illustrates a cross-sectional view of a memory cell including a select device structure in accordance with one or more embodiments of the present disclosure.

FIG. 6 illustrates a cross-sectional view of a memory cell 606 including a select device structure 601 in accordance with one or more embodiments of the present disclosure. The cell 606 can be a resistive memory cell such as cell 106 described in FIG. 1. The select device structure 601 can be a select device structure such as structures 401 and 501 described above in connection with FIGS. 4 and 5 and can exhibit a composite I-V profile such as those described above in connection with FIGS. 2 and 3.

The memory cell 606 includes a resistive storage element 603 formed in series with the select device 601. Although in FIG. 6 the resistive storage element 603 is formed on the select device 601, embodiments are not so limited. For instance, the resistive storage element 603 can be formed on substrate 610 and the select device 601 can be formed on the storage element 603. Alternatively, the resistive storage element 603 can be formed between a first and a second select device of select device structure 601, in various embodiments. Forming the resistive storage element 603 between the select devices of select device structure 601 can provide benefits such as providing a reduced capacitance between metal materials associated with the select devices as compared to embodiments in which the select devices of structure 601 are directly coupled to each other, among other benefits.

As an example, the memory cell 606 can be an RRAM cell in which the resistive storage element 603 includes one or more memory materials, e.g., resistance variable materials, such as a transition metal oxide material or a perovskite, for instance. The memory cell 606 can be a PCRAM cell in which the resistive storage element 603 includes one or more phase change materials such as a chalcogenide, for instance. Other examples of resistance variable materials associated with the storage element 603 can include binary metal oxides, colossal magnetoresistive materials, and/or various polymer-based resistive variable materials, among others.

The select device structure 601 of the memory cell 606 includes a stack of materials formed on the substrate 610. The select device structure 601 can include at least two select devices formed in series. In this example, the select device structure 601 is a composite select device including a pair of two terminal select devices. One or both of the pair of select devices can be non-ohmic select devices, for instance. In this example, the select device structure 601 includes a metal material 612 serving as a first electrode of a first select device, a metal material 616 serving as a common electrode for the first and second select device, and a metal material 622 serving as a second electrode of the second select device of select device structure 601. The particular material 614 formed between electrodes 612 and 616, and the particular material 620 formed between electrodes 616 and 622 can depend on the type of select devices comprising select device structure 601. For instance, in an embodiment in which the structure 601 includes an ovonic threshold switch in series with an MSM diode, the material 614 can be a chalcogenide and the material 620 can be a semiconductor material, or vice versa. In an embodiment in which the structure 601 includes a pair MSM diodes in series, the materials 614 and 620 can be the same or different semiconductor materials.

In various embodiments, the select device structure 601 is a symmetric select device supporting bidirectional current therethrough. However, embodiments are not limited to a symmetric select device structure 601.

The resistive storage element 603 comprises a stack of materials including a metal material 624, e.g., a bottom electrode, a memory material 626 formed on the metal material 624, and a metal material 628, e.g., a top electrode, formed on the memory material 626. The memory cell 606 can be formed in accordance with a self-aligned cross point fabrication process, which can be performed at temperatures below about 500° C. In various embodiments, the memory cell 606 can be formed at temperatures not greater than about 450° C. As such, three dimensional stacking of arrays of memory cells 606 can be enabled, which can provide increased memory density as compared to non-stacked arrays, for instance, among other benefits.

In one or more embodiments, the metal materials 612 and 628 can be, or can be coupled to, a word line and/or bit line corresponding to the cell 606. For example, metal material 612 can be coupled to a word line, e.g., word line 102 shown in FIG. 1, and metal material 628 can be coupled to a bit line, e.g., bit line 104 shown in FIG. 1, or vice versa.

As an example, the select device structure 601 can be tailored such that an on/off current ratio (Ion/Ioff) associated with the select device 601 responsive to an operating voltage, e.g., a select voltage corresponding to a half select method, such as that described in FIG. 1, can be at least about $1\times10^4$ times greater than Ion/Ioff responsive to a half select voltage applied across the device 601. The Ion/Ioff ratio associated with select device structures such as device 601 can be greater than the Ion/Ioff ratio associated with previous select device structures, e.g., select device structures including a single non-ohmic select device having a metal-semiconductor-metal (MSM) configuration, metal-insulator-metal (MIM) configuration, metal-insulator-insulator-metal (MIIM) configuration, or metal-insulator-insulator-insulator-metal (MIIIM) configuration, etc.

In various memory applications, it can be desirable for an I-V profile of a select device to provide a shallow differential resistance slope from 0V through +/−Von/2, where Von can be a select voltage associated with a resistive memory cell, for instance, and a steep differential resistance slope thereafter, e.g., from +/−Von/2 through Von, for instance. In various embodiments, the I-V profile corresponding to the select device structure 601, e.g., the composite I-V profile of the series coupled select devices associated with structure 601, includes a shallow slope through partial select voltage associated with the memory cell 606, e.g., a half select voltage of about +/−4V, and a much sharper slope, e.g., exponential, thereafter. As such, an array of memory cells having an associated half select voltage of about 3V or 4V will experience low leakage and disturb associated with half selected memory cells.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of Equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell, comprising:
   a select device structure including:
   a two terminal select device having a current-voltage (I-V) profile associated therewith; and
   a non-ohmic device in series with the two terminal select device, wherein the combined two terminal select device and non-ohmic device provide a composite I-V profile of the select device structure that includes a modified characteristic as compared to the I-V profile;

wherein the two terminal select device and the non-ohmic device are separate metal-semiconductor-metal (MSM) devices that share a common electrode; and wherein the modified characteristic is based on at least one operating voltage associated with the memory cell.

2. The memory cell of claim 1, wherein the modified characteristic includes a transition voltage level of the composite I-V profile shifted as compared to the I-V profile.

3. The memory cell of claim 2, wherein the transition voltage level is a voltage level at which a differential resistance changes.

4. The memory cell of claim 3, wherein the transition voltage level is a voltage level at which the differential resistance decreases.

5. The memory cell of claim 1, wherein the non-ohmic device is a two terminal non-ohmic device, and wherein at least a portion of the I-V profile associated therewith is exponential with voltage.

6. The memory cell of claim 1, wherein a thickness of a semiconductor material of one of the MSM devices is greater than a thickness of a semiconductor material of the other of the MSM devices.

7. The memory cell of claim 1, wherein a thickness of a metal material of the common electrode is sufficient to prevent coupling between the MSM devices.

8. The memory cell of claim 1, including a resistive storage element in series with the two terminal select device and the non-ohmic device, wherein the at least one operating voltage is at least one of a partial select voltage and a select voltage.

9. A resistive memory cell, comprising:
a select device structure including:
an ovonic threshold switch (OTS) having a threshold voltage (Vt) and a holding voltage (Vh) associated therewith; and
a non-ohmic device in series with the OTS, the non-ohmic device providing a voltage buffer such that a composite I-V profile associated with the select device structure includes a shifted Vt and a shifted Vh as compared to the Vt and the Vh of the OTS;
wherein the non-ohmic select device has a thickness of about 300 Angstroms or less; and
wherein a shift amount corresponding to the shifted Vt and a shift amount corresponding to the shifted Vh is based on at least one operating voltage associated with the resistive memory cell.

10. The resistive memory cell of claim 9, wherein the select device structure includes a stack of materials, wherein:
the OTS includes a chalcogenide material formed between a first and a second conductive material; and
the non-ohmic select device includes at least one of:
a metal-semiconductor-metal (MSM) device;
a metal-semiconductor-metal-semiconductor-metal (MSMSM) device;
a metal-insulator-insulator-metal (MIIM) device; and
a metal-insulator-insulator-metal-insulator-insulator-metal (MIIMIIM) device.

11. The resistive memory cell of claim 9, wherein the at least one operating voltage is at least one of a partial select voltage and a select voltage associated with the resistive memory cell.

12. The resistive memory cell of claim 9, wherein the select device structure includes at least one additional non-ohmic select device in series with the OTS.

13. The resistive memory cell of claim 9, including a resistive storage element in series with the select device structure.

14. The resistive memory cell of claim 13, wherein the resistive storage element includes a phase change material formed between a pair of conductive materials.

15. The resistive memory cell of claim 13, wherein the resistive storage element is a resistance random access memory (RRAM) element.

16. The resistive memory cell of claim 9, wherein the select device structure is a symmetric structure that supports bi-directional current flow therethrough.

17. A method of forming a resistive memory cell of an array of resistive memory cells, the method comprising:
forming a select device structure including a first two terminal select device and a second two terminal select device;
forming the second two terminal select device in series with the first two terminal select device in order to provide a composite I-V profile of the select device structure that includes a modified characteristic as compared to an I-V profile of the first two terminal select device and an I-V profile of the second two terminal select device;
wherein the first two terminal select device is an ovonic threshold switch (OTS) device and the second two terminal select device is a non-ohmic device having a thickness of about 300 Angstroms or less; and
forming a resistive storage element in series with the first and second two terminal select devices;
wherein the modified characteristic includes a transition point of the composite I-V profile as compared to the I-V profile of the second two terminal select device.

18. The method of claim 17, including forming the resistive storage element between the first and second two terminal select devices.

19. The method of claim 17, wherein forming the second two terminal select device includes forming a metal-semiconductor-metal (MSM) device.

20. The method of claim 17, wherein the array is a cross point array.

21. A method of forming a resistive memory cell of an array of resistive memory cells, the method comprising:
forming a select device of a select device structure;
forming a two terminal voltage buffer in series with the select device, the two terminal voltage buffer having an associated current-voltage (I-V) profile which exhibits an exponential current increase with linear change in voltage on at least a portion of the I-V profile;
forming a resistive storage element in series with the select device and the two terminal voltage buffer;
wherein forming the two terminal voltage buffer includes forming material stack including at least one semiconductor material formed between a first and a second metal material; and
wherein a thickness of the at least one semiconductor material is determined based on an operating voltage associated with the memory cell; and
including forming the select device structure at a temperature of not greater than about 450° C.

22. The method of claim 21, wherein forming the two terminal voltage buffer includes forming at least one MSM diode.

23. The method of claim 21, wherein forming the select device includes forming an ovonic threshold switch (OTS) device.

24. The method of claim 21, wherein a type of semiconductor material used to form the two terminal voltage buffer is based on the operating voltage associated with the memory cell.

25. The method of claim 21, wherein forming the resistive storage element includes forming a material stack including at least one of a transition metal oxide and a chalcogenide material.

* * * * *